(12) United States Patent
Ding et al.

(10) Patent No.: US 11,360,134 B2
(45) Date of Patent: Jun. 14, 2022

(54) DETERMINATION OF GAIN CHARACTERISTICS OF A CIRCULARLY-POLARIZED ANTENNA

(71) Applicant: City University of Hong Kong, Kowloon (HK)

(72) Inventors: Chen Ding, Kowloon (HK); Kwai-Man Luk, Kowloon (HK)

(73) Assignee: City University of Hong Kong, Kowloon (HK)

( * ) Notice: Subject to any disclaimer, the term of this patent is extended or adjusted under 35 U.S.C. 154(b) by 387 days.

(21) Appl. No.: 16/783,232

(22) Filed: Feb. 6, 2020

(65) Prior Publication Data

US 2021/0247432 A1 Aug. 12, 2021

(51) Int. Cl.
*G01R 29/08* (2006.01)
*H01Q 11/06* (2006.01)
*H01Q 21/24* (2006.01)
*G01R 29/10* (2006.01)

(52) U.S. Cl.
CPC ......... *G01R 29/0878* (2013.01); *G01R 29/10* (2013.01); *H01Q 11/06* (2013.01); *H01Q 21/24* (2013.01)

(58) Field of Classification Search
CPC ......... G01R 29/10; H01Q 11/06; H01Q 21/24
See application file for complete search history.

(56) References Cited

U.S. PATENT DOCUMENTS

| | | | | |
|---|---|---|---|---|
| 6,448,787 B1* | 9/2002 | Oglesby | ............... | H01Q 19/028 343/703 |
| 2008/0036683 A1* | 2/2008 | Schadler | ................ | H01Q 1/246 343/878 |
| 2011/0134008 A1* | 6/2011 | Schadler | .............. | H01Q 9/0435 343/843 |
| 2017/0187109 A1* | 6/2017 | Wang | ........................ | H01Q 3/36 |
| 2018/0109333 A1* | 4/2018 | Reynolds | ............. | H04B 17/102 |

OTHER PUBLICATIONS

C. Ding and K. M. Luk, "A Wideband High-gain Circularly Polarized Antenna Using Artificial Anisotropic Polarizer", IEEE Trans. Antennas Propag., vol. 67, No. 10, pp. 6645-6649, Oct. 2019.

* cited by examiner

*Primary Examiner* — Alvaro E Fortich
(74) *Attorney, Agent, or Firm* — Renner Kenner Greive Bobak Taylor & Weber

(57) ABSTRACT

System and method for determining gain characteristics of a circularly-polarized antenna. The method includes receiving a measured first amplitude of a forward gain between a circularly-polarized antenna probe of a first type and a linearly-polarized standard-gain antenna, a measured second amplitude of a forward gain between a circularly-polarized antenna probe of a first type and a circularly-polarized antenna under test, and a measured third amplitude of a forward gain between a circularly-polarized antenna probe of a second type and the circularly-polarized antenna under test. The method also includes determining a left-hand circularly-polarized gain and a right-hand circularly-polarized gain of the circularly-polarized antenna under test based on the measured first amplitude, the measured second amplitude, the measured third amplitude, and a cross-polarization level of the circularly-polarized antenna probes of the first and second types. The determination may be performed using one or more processors.

21 Claims, 7 Drawing Sheets

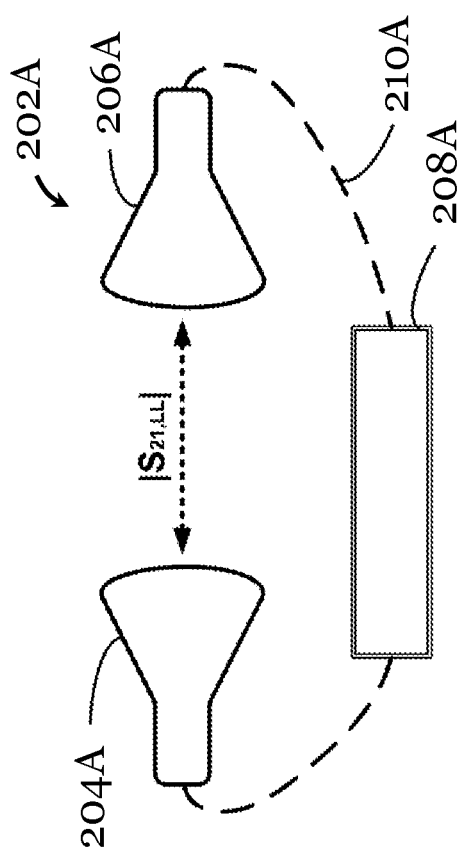
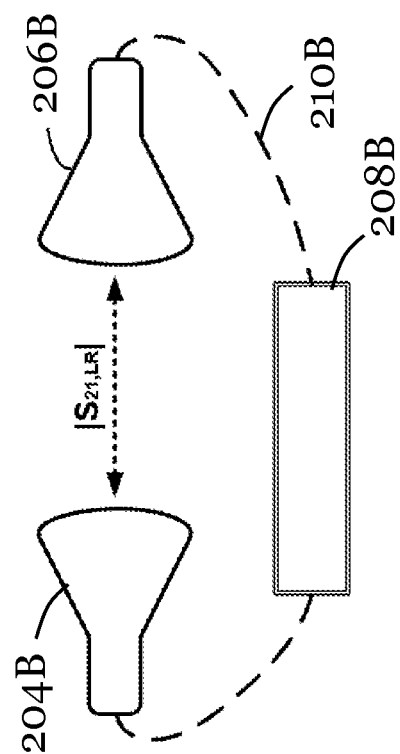
Figure 2A
Figure 2B

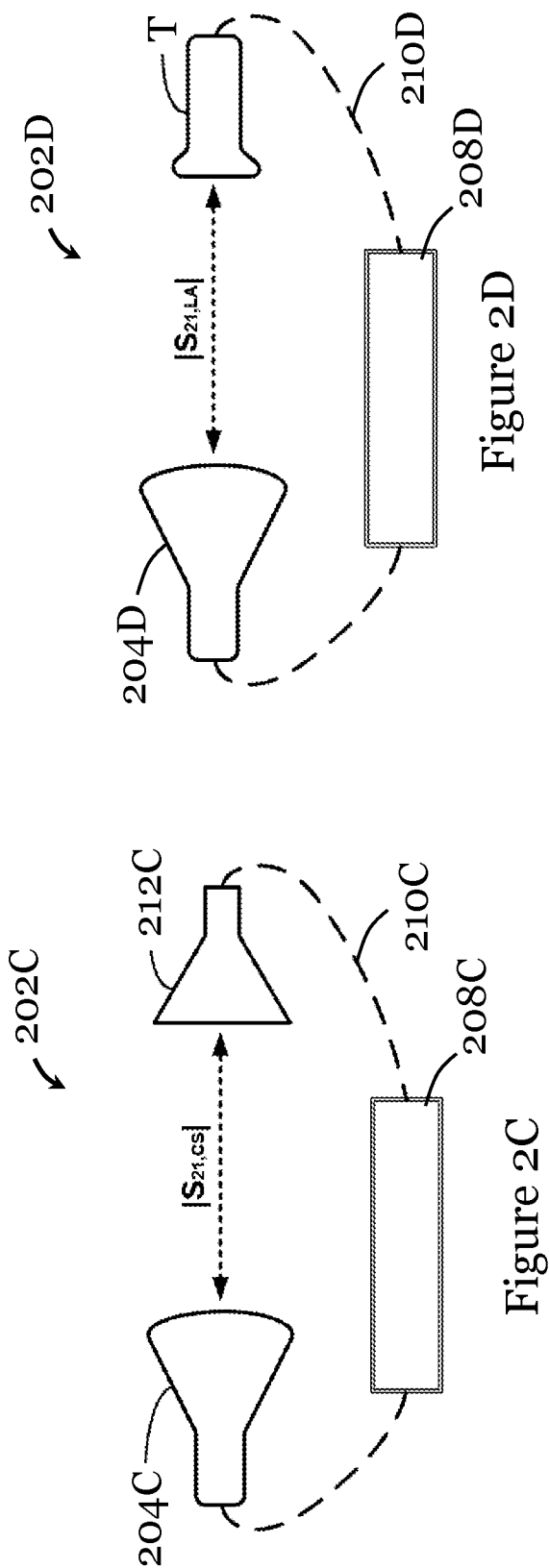
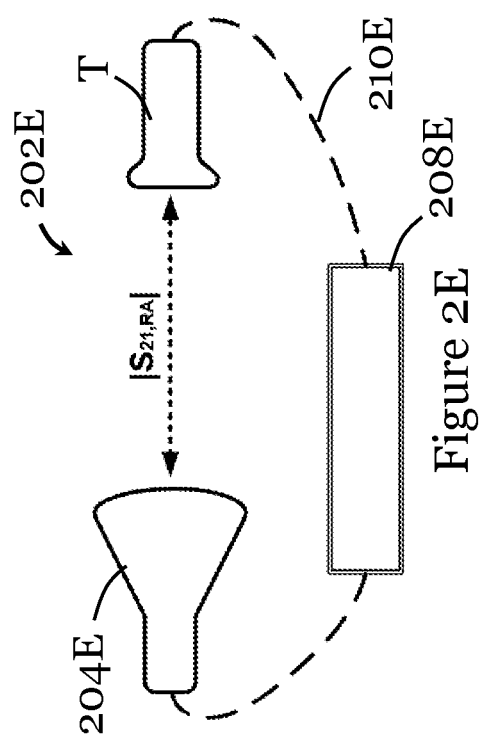
Figure 2D
Figure 2E
Figure 2C

DETERMINATION OF GAIN CHARACTERISTICS OF A CIRCULARLY-POLARIZED ANTENNA

TECHNICAL FIELD

The invention relates to determination of gain characteristics of a circularly-polarized antenna.

BACKGROUND

Circularly-polarized gain(s) of a circularly-polarized antenna can be measured to evaluate the performance or properties of the antenna. Conventional methods for measuring circularly-polarized gain(s) of circularly-polarized antenna require complicated set-up and relies heavily on phase information. These conventional methods may not be suitable for high frequency operations. For example, at high frequency operations such as at millimeter-wave and terahertz ranges, the gains of circularly-polarized antenna are difficult to measure because of the relatively short wavelength and the relatively high sensitivity to misalignment error. Also, at millimeter-wave and terahertz ranges, the frequency extenders required for measurement are bulky (hence difficult to manipulate) and are delicate (hence prone to be damaged when moved or rotated). Furthermore, existing circularly-polarized standard-gain horns usually provide a working bandwidth of less than 10%. This further complicates the measurement, especially for broadband circularly-polarized antennas.

SUMMARY OF THE INVENTION

It is an object of the invention to address the above needs, to overcome or substantially ameliorate the above disadvantages or, more generally, to provide an improved or alternative system and method for determining gain characteristics of a circularly-polarized antenna.

In accordance with a first aspect of the invention, there is provided a method for determining gain characteristics of a circularly-polarized antenna. The method includes receiving a measured first amplitude of a forward gain between a circularly-polarized antenna probe of a first type and a linearly-polarized standard-gain antenna, a measured second amplitude of a forward gain between a circularly-polarized antenna probe of a first type and a circularly-polarized antenna under test, and a measured third amplitude of a forward gain between a circularly-polarized antenna probe of a second type and the circularly-polarized antenna under test. The method also includes determining a left-hand circularly-polarized gain and a right-hand circularly-polarized gain of the circularly-polarized antenna under test based on the measured first amplitude, the measured second amplitude, the measured third amplitude, and a cross-polarization level of the circularly-polarized antenna probes of the first and second types. The circularly-polarized antenna probe of the first type is one of a left-hand circularly-polarized antenna probe and a right-hand circularly-polarized antenna probe, and the circularly-polarized antenna probe of the second type is the other one of the left-hand circularly-polarized antenna probe and the right-hand circularly-polarized antenna probe. The forward gain(s) may be forward voltage gain(s). The linearly-polarized standard-gain antenna preferably has a cross-polarization level that is insignificant.

In one embodiment of the first aspect, the method also includes measuring a first amplitude of a forward gain between a circularly-polarized antenna probe of a first type and a linearly-polarized standard-gain antenna to determine the measured first amplitude; measuring a second amplitude of a forward gain between a circularly-polarized antenna probe of a first type and a circularly-polarized antenna under test to determine the measured second amplitude; and measuring a third amplitude of a forward gain between a circularly-polarized antenna probe of a second type and the circularly-polarized antenna under test to determine the measured third amplitude. The forward gain(s) may be forward voltage gain(s). The order of the measurement steps can be implemented differently.

In one embodiment of the first aspect, the circularly-polarized antenna probe of the first type used for measuring the first amplitude and the circularly-polarized antenna probe of the first type used for measuring the second amplitude is the same probe.

In one embodiment of the first aspect, the left-hand circularly-polarized gain of the left-hand circularly-polarized antenna probe is substantially equal to right-hand circularly-polarized gain of the right-hand circularly-polarized antenna probe, and the right-hand circularly-polarized gain of the left-hand circularly-polarized antenna probe is substantially equal to left-hand circularly-polarized gain of the right-hand circularly-polarized antenna probe.

In one embodiment of the first aspect, the left-hand circularly-polarized antenna probe and a right-hand circularly-polarized antenna probe have the same construction (except for the difference in polarization). For example, they may have the same shape, form, and/or size.

In one embodiment of the first aspect, the left-hand circularly-polarized antenna probe comprises a first linearly-polarized antenna and a first polarizer, and the right-hand circularly-polarized antenna probe comprises a second linearly-polarized antenna and a second polarizer. Optionally, the first polarizer is arranged at a first angle with respect to a E-plane of the linearly-polarized antenna, and the second polarizer is arranged at a second angle, different from the first angle, with respect to a E-plane of the linearly-polarized antenna. A difference between the first angle and the second angle may be about 90 degrees. For example, the first angle may be about 45 degrees with respect to a E-plane of the linearly-polarized antenna, and the second angle may be about 135 degrees to the E-plane of the linearly-polarized antenna. The polarizer may be constructed differently, e.g., using a patch with openings, optionally arranged in a regular array.

In one embodiment of the first aspect, the left-hand circularly-polarized gain and the right-hand circularly-polarized gain of the circularly-polarized antenna under test are determined based on:

$$G_{AUT,LHCP} = \frac{G_{SGA,LP}}{2(1-p)} \cdot \left( \frac{|S_{21,LA}|^2}{|S_{21,CS}|^2} - p \frac{|S_{21,RA}|^2}{|S_{21,CS}|^2} \right)$$

$$G_{AUT,RHCP} = \frac{G_{SGA,LP}}{2(1-p)} \cdot \left( \frac{|S_{21,RA}|^2}{|S_{21,CS}|^2} - p \frac{|S_{21,LA}|^2}{|S_{21,CS}|^2} \right)$$

where $G_{AUT,LHCP}$ is the left-hand circularly-polarized gain of the circularly-polarized antenna under test, $G_{AUT,RHCP}$ is the right-hand circularly-polarized gain of the circularly-polarized antenna under test, $G_{SGA,LP}$ is a linearly-polarized gain of the linearly-polarized standard-gain antenna, p is the cross-polarization level of the circularly-polarized antenna probes of the first and second types, $|S_{21,CS}|$ is the measured first amplitude, $|S_{21,LA}|$ is the measured second amplitude, and $|S_{21,RA}|$ is the measured third amplitude.

In one embodiment of the first aspect, measuring the first amplitude of a forward gain between the circularly-polarized antenna probe of the first type and the linearly-polarized standard-gain antenna comprises: positioning, relatively, the circularly-polarized antenna probe of the first type and the linearly-polarized standard-gain antenna, and transmitting signals from one of the circularly-polarized antenna probe of the first type and the linearly-polarized standard-gain antenna to the other one of the circularly-polarized antenna probe of the first type and the linearly-polarized standard-gain antenna for measurement.

In one embodiment of the first aspect, measuring the second amplitude of a forward gain between the circularly-polarized antenna probe of the first type and the circularly-polarized antenna under test comprises: positioning, relatively, the circularly-polarized antenna probe of the first type and the circularly-polarized antenna under test, and transmitting signals from one of the circularly-polarized antenna probe and the linearly-polarized standard-gain antenna to the other one of the circularly-polarized antenna probe and the linearly-polarized standard-gain antenna for measurement.

In one embodiment of the first aspect, measuring the third amplitude of a forward gain between the circularly-polarized antenna probe of the second type and the circularly-polarized antenna under test comprises: positioning, relatively, the circularly-polarized antenna probe of the second type and the circularly-polarized antenna under test, and transmitting signals from one of the circularly-polarized antenna probe of the second type and the linearly-polarized standard-gain antenna to the other one of the circularly-polarized antenna probe of the second type and the linearly-polarized standard-gain antenna for measurement.

In one embodiment of the first aspect, a relative position between the circularly-polarized antenna probe of the first type and the linearly-polarized standard-gain antenna during the measurement, a relative position between the circularly-polarized antenna probe of the first type and the circularly-polarized antenna under test during the measurement, and a relative position between the circularly-polarized antenna probe of the second type and the circularly-polarized antenna under test during the measurement are substantially the same.

In one embodiment of the first aspect, the measurements of the first amplitude, the second amplitude, and the third amplitude are measured using the same measurement device. The measurement device may include a spectrum analyzer and a signal generator. The signal generator may be used to generate signals for transmission in the measuring steps.

In one embodiment of the first aspect, the left-hand circularly-polarized gain and the right-hand circularly-polarized gain of the circularly-polarized antenna under test are determined using one or more processors.

In one embodiment of the first aspect, the method further includes determining the cross-polarization level of the circularly-polarized antenna probes of the first and second types.

In one embodiment of the first aspect, determining the cross-polarization level of the circularly-polarized antenna probes of the first and second types comprises: measuring a fourth amplitude of a forward gain between two substantially identical circularly-polarized antenna probes of the first type or between two substantially identical circularly-polarized antenna probes of the second type; and measuring a fifth amplitude of a forward gain between a circularly-polarized antenna probe of the first type and a circularly-polarized antenna probe of the second type. The forward gain(s) may be forward voltage gain(s). The order of the measurement steps can be implemented differently.

In one embodiment of the first aspect, measuring the fourth amplitude of a forward gain between two substantially identical circularly-polarized antenna probes of the first type or between two substantially identical circularly-polarized antenna probes of the second type comprises: positioning, relatively, the two substantially identical circularly-polarized antenna probes of the first type or the two substantially identical circularly-polarized antenna probes of the second type, and transmitting signals from one of the two substantially identical circularly-polarized antenna probes to the other one of two substantially identical circularly-polarized antenna probes for measurement.

In one embodiment of the first aspect, measuring the fifth amplitude of a forward gain between a circularly-polarized antenna probe of the first type and a circularly-polarized antenna probe of the second type comprises: positioning, relatively, the circularly-polarized antenna probe of the first type and the circularly-polarized antenna probe of the second type, and transmitting signals from one of the circularly-polarized antenna probe of the first type and the circularly-polarized antenna probe of the second type to the other one of the circularly-polarized antenna probe of the first type and the circularly-polarized antenna probe of the second type for measurement.

In one embodiment of the first aspect, the fourth amplitude and the fifth amplitude are measured using the same measurement device. The measurement device may include a spectrum analyzer and a signal generator. The signal generator may be used to generate signals for transmission in the measuring steps.

In one embodiment of the first aspect, the cross-polarization level of the circularly-polarized antenna probes of the first and second types is determined based on:

$$p = \frac{|S_{21,LL}|^2}{|S_{21,LR}|^2} - \sqrt{\frac{|S_{21,LL}|^4}{|S_{21,LR}|^4} - 1}$$

where p is the cross-polarization level of the circularly-polarized antenna probe of the first and second types, $|S_{21,LL}|$ is the measured fourth amplitude, and $|S_{21,LR}|$ is the measured fifth amplitude. The determination may be performed by one or more processors.

In one embodiment of the first aspect, the circularly-polarized antenna under test is arranged for operation in millimeter-wave and terahertz ranges.

In accordance with a second aspect of the invention, there is provided a method for evaluating a performance of a circularly-polarized antenna, comprising: determining gain characteristics of a circularly-polarized antenna using the method of the first aspect, and determining the radiation pattern of the circularly-polarized antenna.

In accordance with a third aspect of the invention, there is provided a system for determining gain characteristics of a circularly-polarized antenna. The system includes one or more processors arranged to: receive a measured first amplitude of a forward gain between a circularly-polarized antenna probe of a first type and a linearly-polarized standard-gain antenna, a measured second amplitude of a forward gain between a circularly-polarized antenna probe of a first type and a circularly-polarized antenna under test, and a measured third amplitude of a forward gain between a circularly-polarized antenna probe of a second type and the circularly-polarized antenna under test. The one or more processors are further arranged to determine a left-hand circularly-polarized gain and a right-hand circularly-polarized gain of the circularly-polarized antenna under test based on the measured first amplitude, the measured second amplitude, the measured third amplitude, and a cross-polarization level of the circularly-polarized antenna probes of the first and second types. The circularly-polarized antenna probe of the first type is one of a left-hand circularly-polarized antenna probe and a right-hand circularly-polarized antenna probe, and the circularly-polarized antenna probe of the second type is the other one of the left-hand circularly-polarized antenna probe and the right-hand circularly-polarized antenna probe. The forward gain(s) may be forward voltage gain(s). The linearly-polarized standard-gain antenna preferably has a cross-polarization level that is insignificant.

In one embodiment of the third aspect, the system includes a measurement device arranged to: measure a first amplitude of a forward gain between a circularly-polarized antenna probe of a first type and a linearly-polarized standard-gain antenna to determine the measured first amplitude; measure a second amplitude of a forward gain between a circularly-polarized antenna probe of a first type and a circularly-polarized antenna under test to determine the measured second amplitude; and measure a third amplitude of a forward gain between a circularly-polarized antenna probe of a second type and the circularly-polarized antenna under test to determine the measured third amplitude. The measurement device may be operably connected with the one or more processors. The measurement device may be integrated with the one or more processors. The measurement device may include a spectrum analyzer and a signal generator. The forward gain(s) may be forward voltage gain(s).

In one embodiment of the third aspect, the left-hand circularly-polarized gain of the left-hand circularly-polarized antenna probe is substantially equal to right-hand circularly-polarized gain of the right-hand circularly-polarized antenna probe, and the right-hand circularly-polarized gain of the left-hand circularly-polarized antenna probe is substantially equal to left-hand circularly-polarized gain of the right-hand circularly-polarized antenna probe.

In one embodiment of the third aspect, the left-hand circularly-polarized antenna probe and a right-hand circularly-polarized antenna probe have the same construction (except for the difference in polarization). For example, they may have the same shape, form, and/or size.

In one embodiment of the third aspect, the left-hand circularly-polarized antenna probe comprises a first linearly-polarized antenna and a first polarizer, and the right-hand circularly-polarized antenna probe comprises a second linearly-polarized antenna and a second polarizer.

In one embodiment of the third aspect, the first polarizer is arranged at a first angle with respect to a E-plane of the linearly-polarized antenna, and the second polarizer is arranged at a second angle, different from the first angle, with respect to a E-plane of the linearly-polarized antenna.

In one embodiment of the third aspect, a difference between the first angle and the second angle is about 90 degrees.

In one embodiment of the third aspect, the one or more processors are arranged to determine the left-hand circularly-polarized gain and the right-hand circularly-polarized gain of the circularly-polarized antenna under test based on:

$$G_{AUT,LHCP} = \frac{G_{SGA,LP}}{2(1-p)} \cdot \left( \frac{|S_{21,LA}|^2}{|S_{21,CS}|^2} - p\frac{|S_{21,RA}|^2}{|S_{21,CS}|^2} \right)$$

$$G_{AUT,RHCP} = \frac{G_{SGA,LP}}{2(1-p)} \cdot \left( \frac{|S_{21,RA}|^2}{|S_{21,CS}|^2} - p\frac{|S_{21,LA}|^2}{|S_{21,CS}|^2} \right)$$

where $G_{AUT,LHCP}$ is the left-hand circularly-polarized gain of the circularly-polarized antenna under test, $G_{AUT,RHCP}$ is the right-hand circularly-polarized gain of the circularly-polarized antenna under test, $G_{SGA,LP}$ is a linearly-polarized gain of the linearly-polarized standard-gain antenna, p is the cross-polarization level of the circularly-polarized antenna probes of the first and second types, $|S_{21,CS}|$ is the measured first amplitude, $|S_{21,LA}|$ is the measured second amplitude, and $|S_{21,RA}|$ is the measured third amplitude.

In one embodiment of the third aspect, the measurement device is further arranged to: measure a fourth amplitude of a forward gain between two substantially identical circularly-polarized antenna probes of the first type or between two substantially identical circularly-polarized antenna probes of the second type; and measure a fifth amplitude of a forward gain between a circularly-polarized antenna probe of the first type and a circularly-polarized antenna probe of the second type. The forward gain(s) may be forward voltage gain(s).

In one embodiment of the third aspect, the one or more processors are further arranged to determine the cross-polarization level of the circularly-polarized antenna probes of the first and second types is determined based on:

$$p = \frac{|S_{21,LL}|^2}{|S_{21,LR}|^2} - \sqrt{\frac{|S_{21,LL}|^4}{|S_{21,LR}|^4} - 1}$$

where p is the cross-polarization level of the circularly-polarized antenna probe of the first and second types, $|S_{21,LL}|$ is the measured fourth amplitude, and $|S_{21,LR}|$ is the measured fifth amplitude.

In one embodiment of the third aspect, the circularly-polarized antenna under test is arranged for operation in millimeter-wave and terahertz ranges.

In accordance with a fourth aspect of the invention, there is provided a non-transistory computer readable medium storing computer instructions that, when executed by one or more processors, are arranged to cause the one or more processors to perform the method for determining gain characteristics of a circularly-polarized antenna of the first aspect.

In accordance with a fifth aspect of the invention, there is provided a non-transistory computer readable medium storing computer instructions that, when executed by one or more processors, are arranged to cause the one or more processors to perform a method for determining gain characteristics of a circularly-polarized antenna, the method including: determining the left-hand circularly-polarized gain and the right-hand circularly-polarized gain of the circularly-polarized antenna under test based on:

$$G_{AUT,LHCP} = \frac{G_{SGA,LP}}{2(1-p)} \cdot \left( \frac{|S_{21,LA}|^2}{|S_{21,CS}|^2} - p\frac{|S_{21,RA}|^2}{|S_{21,CS}|^2} \right)$$

-continued $$G_{AUT,RHCP} = \frac{G_{SGA,LP}}{2(1-p)} \cdot \left(\frac{|S_{21,RA}|^2}{|S_{21,CS}|^2} - p\frac{|S_{21,LA}|^2}{|S_{21,CS}|^2}\right)$$

where $G_{AUT,LHCP}$ is the left-hand circularly-polarized gain of the circularly-polarized antenna under test, $G_{AUT,RHCP}$ is the right-hand circularly-polarized gain of the circularly-polarized antenna under test, $G_{SGA,LP}$ is a linearly-polarized gain of the linearly-polarized standard-gain antenna, p is the cross-polarization level of the circularly-polarized antenna probes of the first and second types, $|S_{21,CS}|$ is a measured first amplitude of a forward gain between a circularly-polarized antenna probe of a first type and a linearly-polarized standard-gain antenna, $|S_{21,LA}|$ is a measured second amplitude of a forward gain between a circularly-polarized antenna probe of a first type and a circularly-polarized antenna under test, and $|S_{21,RA}|$ is a measured third amplitude of a forward gain between a circularly-polarized antenna probe of a second type and the circularly-polarized antenna under test. The forward gain(s) may be forward voltage gain(s).

In one embodiment of the fifth aspect, the method further including: determining the cross-polarization level of the circularly-polarized antenna probes of the first and second types is determined based on:

$$p = \frac{|S_{21,LL}|^2}{|S_{21,LR}|^2} - \sqrt{\frac{|S_{21,LL}|^4}{|S_{21,LR}|^4} - 1}$$

where p is the cross-polarization level of the circularly-polarized antenna probe of the first and second types, $|S_{21,LL}|$ is the measured fourth amplitude of a forward gain between two substantially identical circularly-polarized antenna probes of the first type or between two substantially identical circularly-polarized antenna probes of the second type, and $|S_{21,LR}|$ is the measured fifth amplitude of a forward gain between a circularly-polarized antenna probe of the first type and a circularly-polarized antenna probe of the second type. The forward gain(s) may be forward voltage gain(s).

In accordance with a sixth aspect of the invention, there is provided a method for determining gain characteristics of a circularly-polarized antenna. The method includes receiving a measured first amplitude of a forward gain between a first circularly-polarized antenna probe and a linearly-polarized standard-gain antenna, a measured second amplitude of a forward gain between the first circularly-polarized antenna probe and a circularly-polarized antenna under test, and a measured third amplitude of a forward gain between a second circularly-polarized antenna probe and the circularly-polarized antenna under test. The method further includes determining a left-hand circularly-polarized gain and a right-hand circularly-polarized gain of the circularly-polarized antenna under test based on the measured first amplitude, the measured second amplitude, the measured third amplitude, and a cross-polarization level of the first and second circularly-polarized antenna probes. The first circularly-polarized antenna probe is one of a left-hand circularly-polarized antenna probe and a right-hand circularly-polarized antenna probe, and the second circularly-polarized antenna probe is the other one of the left-hand circularly-polarized antenna probe and the right-hand circularly-polarized antenna probe. The forward gain(s) may be forward voltage gain(s). The linearly-polarized standard-gain antenna preferably has a cross-polarization level that is insignificant.

In one embodiment of the sixth aspect, the method also includes measuring a first amplitude of a forward gain between a first circularly-polarized antenna probe and a linearly-polarized standard-gain antenna to determine the first measured first amplitude; measuring a second amplitude of a forward gain between the first circularly-polarized antenna probe and a circularly-polarized antenna under test to determine the second measured first amplitude; and measuring a third amplitude of a forward gain between a second circularly-polarized antenna probe and the circularly-polarized antenna under test to determine the third measured first amplitude. The forward gain(s) may be forward voltage gain(s). The order of the measurement steps can be implemented differently.

In one embodiment of the sixth aspect, the left-hand circularly-polarized gain of the left-hand circularly-polarized antenna probe is substantially equal to right-hand circularly-polarized gain of the right-hand circularly-polarized antenna probe, and the right-hand circularly-polarized gain of the left-hand circularly-polarized antenna probe is substantially equal to left-hand circularly-polarized gain of the right-hand circularly-polarized antenna probe.

In one embodiment of the sixth aspect, the left-hand circularly-polarized antenna probe and a right-hand circularly-polarized antenna probe have the same construction (except for the difference in polarization). For example, they may have the same shape, form, and/or size.

In one embodiment of the sixth aspect, the left-hand circularly-polarized antenna probe comprises a first linearly-polarized antenna and a first polarizer, and the right-hand circularly-polarized antenna probe comprises a second linearly-polarized antenna and a second polarizer.

In one embodiment of the sixth aspect, the first polarizer is arranged at a first angle with respect to a E-plane of the linearly-polarized antenna, and the second polarizer is arranged at a second angle, different from the first angle, with respect to a E-plane of the linearly-polarized antenna.

In one embodiment of the sixth aspect, a difference between the first angle and the second angle is about 90 degrees.

In one embodiment of the sixth aspect, the left-hand circularly-polarized gain and the right-hand circularly-polarized gain of the circularly-polarized antenna under test are determined based on:

$$G_{AUT,LHCP} = \frac{G_{SGA,LP}}{2(1-p)} \cdot \left(\frac{|S_{21,LA}|^2}{|S_{21,CS}|^2} - p\frac{|S_{21,RA}|^2}{|S_{21,CS}|^2}\right)$$

$$G_{AUT,RHCP} = \frac{G_{SGA,LP}}{2(1-p)} \cdot \left(\frac{|S_{21,RA}|^2}{|S_{21,CS}|^2} - p\frac{|S_{21,LA}|^2}{|S_{21,CS}|^2}\right)$$

where $G_{AUT,LHCP}$ is the left-hand circularly-polarized gain of the circularly-polarized antenna under test, $G_{AUT,RHCP}$ is the right-hand circularly-polarized gain of the circularly-polarized antenna under test, $G_{SGA,LP}$ is a linearly-polarized gain of the linearly-polarized standard-gain antenna, p is the cross-polarization level of the first and second circularly-polarized antenna probes, $|S_{21,CS}|$ is the measured first amplitude, $|S_{21,LA}|$ is the measured second amplitude, and $|S_{21,RA}|$ is the measured third amplitude.

In one embodiment of the sixth aspect, measuring the first amplitude of a forward gain between the first circularly-polarized antenna probe and the linearly-polarized standard-gain antenna comprises: positioning, relatively, the first circularly-polarized antenna probe and the linearly-polarized standard-gain antenna, and transmitting signals from one of the first circularly-polarized antenna probe and the linearly-polarized standard-gain antenna to the other one of the first circularly-polarized antenna probe and the linearly-polarized standard-gain antenna for measurement.

In one embodiment of the sixth aspect, measuring the second amplitude of a forward gain between the first circularly-polarized antenna probe and the circularly-polarized antenna under test comprises: positioning, relatively, the first circularly-polarized antenna probe and the circularly-polarized antenna under test, and transmitting signals from one of the circularly-polarized antenna probe and the linearly-polarized standard-gain antenna to the other one of the circularly-polarized antenna probe and the linearly-polarized standard-gain antenna for measurement.

In one embodiment of the sixth aspect, measuring the third amplitude of a forward gain between the second circularly-polarized antenna probe and the circularly-polarized antenna under test comprises: positioning, relatively, the second circularly-polarized antenna probe and the circularly-polarized antenna under test, and transmitting signals from one of the second circularly-polarized antenna probe and the linearly-polarized standard-gain antenna to the other one of the second circularly-polarized antenna probe and the linearly-polarized standard-gain antenna for measurement.

In one embodiment of the sixth aspect, a relative position between the first circularly-polarized antenna probe and the linearly-polarized standard-gain antenna during the measurement, a relative position between the first circularly-polarized antenna probe and the circularly-polarized antenna under test during the measurement, and a relative position between the second circularly-polarized antenna probe and the circularly-polarized antenna under test during the measurement are substantially the same.

In one embodiment of the sixth aspect, the measurements of the first amplitude, the second amplitude, and the third amplitude are measured using the same measurement device. The measurement device may include a spectrum analyzer and a signal generator. The signal generator may be used to generate signals for transmission in the measuring steps.

In one embodiment of the sixth aspect, the left-hand circularly-polarized gain and the right-hand circularly-polarized gain of the circularly-polarized antenna under test are determined using one or more processors.

In one embodiment of the sixth aspect, the method further includes determining the cross-polarization level of the first and second circularly-polarized antenna probes.

In one embodiment of the sixth aspect, determining the cross-polarization level of the first and second circularly-polarized antenna probes comprises: measuring a fourth amplitude of a forward gain between the first circularly-polarized antenna probe and a further first circularly-polarized antenna probe constructed substantially the same as the first circularly-polarized antenna probe, or between the second circularly-polarized antenna probe and a further second circularly-polarized antenna probe constructed substantially the same as the second circularly-polarized antenna probe; and measuring a fifth amplitude of a forward gain between one of the first circularly-polarized antenna probe and the further first circularly-polarized antenna probe and one of the second circularly-polarized antenna probe and the further second circularly-polarized antenna probe.

The forward gain(s) may be forward voltage gain(s). The order of the measurement steps can be implemented differently.

In one embodiment of the sixth aspect, measuring the fourth amplitude of a forward gain between the two substantially identical first circularly-polarized antenna probes or between the two substantially identical second circularly-polarized antenna probes comprises: positioning, relatively, the two substantially identical first or second circularly-polarized antenna probes, and transmitting signals from one of the two substantially identical first or second circularly-polarized antenna probes to the other one of two substantially identical first or second circularly-polarized antenna probes for measurement.

In one embodiment of the sixth aspect, measuring the fifth amplitude of a forward gain between the first circularly-polarized antenna probe and the second circularly-polarized antenna probe comprises: positioning, relatively, one of the two substantially identical first circularly-polarized antenna probes and one of the two substantially identical second circularly-polarized antenna probes, and transmitting signals from the positioned first (or second) circularly-polarized antenna probe to the positioned second (or first) circularly-polarized antenna probe for measurement.

In one embodiment of the sixth aspect, the fourth amplitude and the fifth amplitude are measured using the same measurement device. The measurement device may include a spectrum analyzer and a signal generator. The signal generator may be used to generate signals for transmission in the measuring steps.

In one embodiment of the sixth aspect, the cross-polarization level of the first and second circularly-polarized antenna probes is determined based on:

$$p = \frac{|S_{21,LL}|^2}{|S_{21,LR}|^2} - \sqrt{\frac{|S_{21,LL}|^4}{|S_{21,LR}|^4} - 1}$$

where p is the cross-polarization level of the first and second circularly-polarized antenna probes, $|S_{21,LL}|$ is the measured fourth amplitude, and $|S_{21,LR}|$ is the measured fifth amplitude.

In one embodiment of the sixth aspect, the circularly-polarized antenna under test is arranged for operation in millimeter-wave and terahertz ranges.

BRIEF DESCRIPTION OF THE DRAWINGS

Embodiments of the invention will now be described, by way of example, with reference to the accompanying drawings in which:

FIG. 2A is schematic diagram showing a setup for measuring an amplitude of the forward gain between two circularly-polarized antenna probes of the same type (e.g., two left-hand circularly-polarized antenna probes or two right-hand circularly-polarized antenna probes);

FIG. 2B is schematic diagram showing a setup for measuring an amplitude of the forward gain between two circularly-polarized antenna probes of the different types (e.g., a left-hand circularly-polarized antenna probe and a right-hand circularly-polarized antenna probe);

FIG. 2C is schematic diagram showing a setup for measuring an amplitude of the forward gain between a left-hand or right-hand circularly-polarized antenna probe and a linearly-polarized standard-gain antenna;

FIG. 2D is schematic diagram showing a setup for measuring an amplitude of the forward gain between a left-hand circularly-polarized antenna probe and a circularly-polarized antenna under test;

FIG. 2E is schematic diagram showing a setup for measuring an amplitude of the forward gain between a right-hand circularly-polarized antenna probe and the circularly-polarized antenna under test;

DETAILED DESCRIPTION

Figure 1:
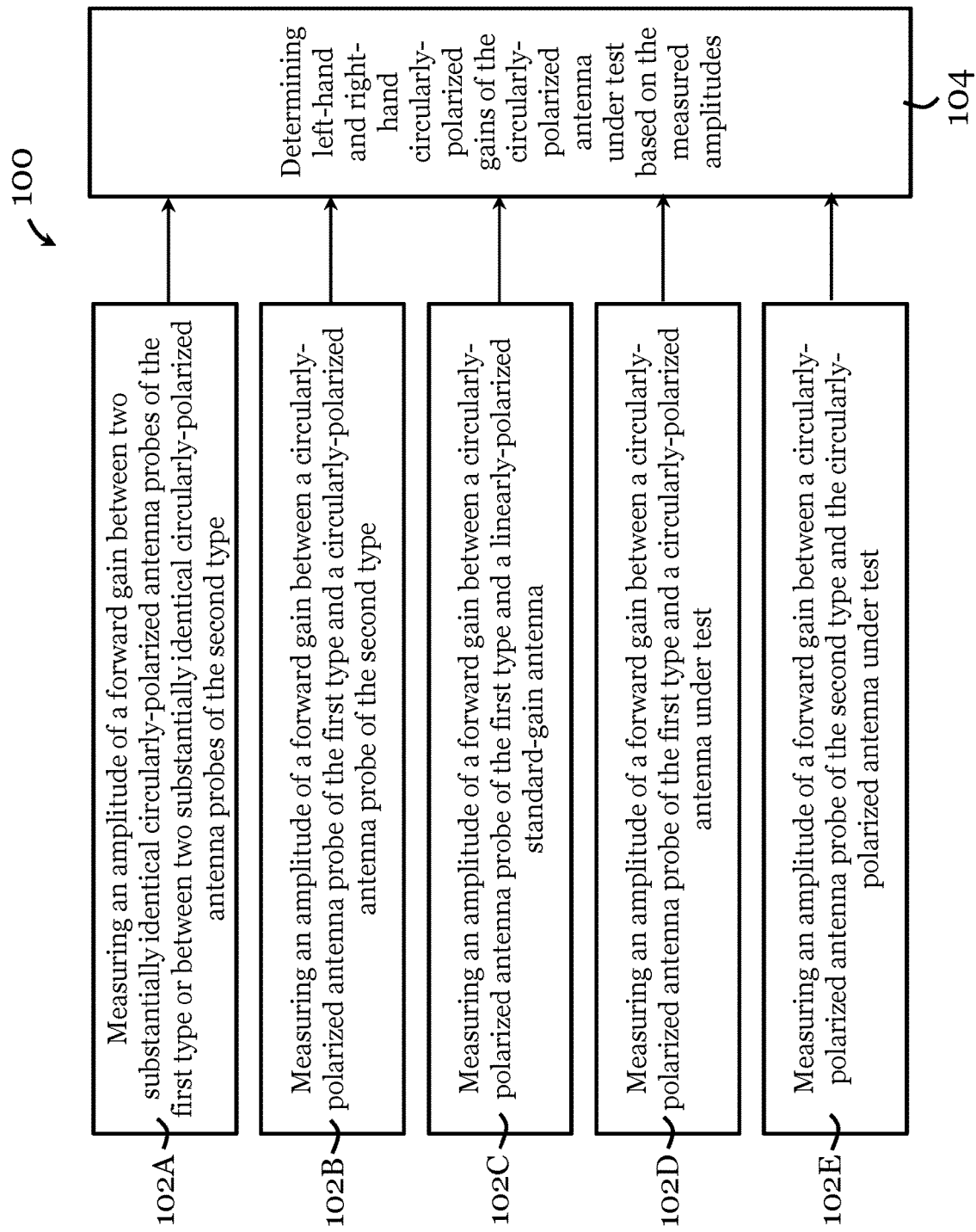
FIG. 1 is a flowchart showing a method for determining gain characteristics of a circularly-polarized antenna in one embodiment of the invention.

FIG. 1 illustrates a method 100 for determining gain characteristics of a circularly-polarized antenna in one embodiment of the invention. The circularly-polarized antenna under test in this method 100 is arranged for operation in millimeter-wave and terahertz ranges.

The method 100 includes, in step 102A, measuring an amplitude of a forward gain (e.g., forward voltage gain) between two substantially identical circularly-polarized antenna probes of the first type or between two substantially identical circularly-polarized antenna probes of the second type. In this example, the circularly-polarized antenna probe of the first type is a left-hand circularly-polarized antenna probe, and the circularly-polarized antenna probe of the second type is a right-hand circularly-polarized antenna probe. The measurement in step 102A includes connecting two substantially identical circularly-polarized antenna probes of the first type (or of the second type) to a measurement device, positioning the two substantially identical circularly-polarized antenna probes of the first type (or of the second type) relative to each other, and transmitting signals from one of the probes (e.g., using signals generated by the measurement device) to the other one of the probes for measurement.

The method 100 includes, in step 102B, measuring an amplitude of a forward gain (e.g., forward voltage gain) between a circularly-polarized antenna probe of the first type and a circularly-polarized antenna probe of the second type. The circularly-polarized antenna probe of the first type and the circularly-polarized antenna probe of the second type in step 102B may be the probes used in step 102A. The measurement in step 102B includes connecting the circularly-polarized antenna probe of the first type and the circularly-polarized antenna probe of the second type to a measurement device, positioning the two circularly-polarized antenna probes relative to each other, and transmitting signals from one of the probes (e.g., using signals generated by the measurement device) to the other one of the probes for measurement. The measurement device used may be the measurement device used in step 102A.

The method 100 includes, in step 102C, measuring an amplitude of a forward gain (e.g., forward voltage gain) between a circularly-polarized antenna probe of the first type and a linearly-polarized standard-gain antenna. The circularly-polarized antenna probe of the first type may be the one used in step 102A and/or step 102B. The measurement in step 102C includes connecting the circularly-polarized antenna probe of the first type and the linearly-polarized standard-gain antenna to a measurement device, positioning the circularly-polarized antenna probe of the first type and the linearly-polarized standard-gain antenna relative to each other, and transmitting signals from one of the probes (e.g., using signals generated by the measurement device) to the other one of the probes for measurement. The measurement device used may be the measurement device used in step 102A and/or step 102B.

The method 100 includes, in step 102D, measuring an amplitude of a forward gain (e.g., forward voltage gain) between a circularly-polarized antenna probe of the first type and a circularly-polarized antenna under test. The circularly-polarized antenna probe of the first type may be the one used in step 102A, step 102B, and/or step 102C. The measurement in step 102D includes connecting the circularly-polarized antenna probe of the first type and the circularly-polarized antenna under test to a measurement device, positioning the circularly-polarized antenna probe of the first type and the circularly-polarized antenna under test relative to each other, and transmitting signals from one of the probes (e.g., using signals generated by the measurement device) to the other one of the probes for measurement. The measurement device used may be the measurement device used in step 102A, step 102B, and/or step 102C.

The method 100 includes, in step 102E, measuring an amplitude of a forward gain between a circularly-polarized antenna probe of the second type and the circularly-polarized antenna under test The circularly-polarized antenna probe of the second type may be the one used in step 102A and/or step 102B. The measurement in step 102E includes connecting the circularly-polarized antenna probe of the second type and the circularly-polarized antenna under test to a measurement device, positioning the circularly-polarized antenna probe of the second type and the circularly-polarized antenna under test relative to each other, and transmitting signals from one of the probe and antenna (e.g., using signals generated by the measurement device) to the other one of the probe and antenna for measurement. The measurement device used may be the measurement device used in step 102A, step 102B, step 102C and/or step 102D.

After the measurement in steps 102A to 102E, which can be performed in any order, the method 100 proceeds to step 104, in which left-hand and right-hand circularly-polarized gains of the circularly-polarized antenna under test are determined based on the measured amplitudes obtained in steps 102A to 102E. The determination in step 104 is performed by one or more processors.

The determination in step 104 may include determining the cross-polarization level of the circularly-polarized antenna probes of the first and second types, and then determining a left-hand circularly-polarized gain and a right-hand circularly-polarized gain of the circularly-polarized antenna under test based on the measured amplitudes in step 102C to 102E and the determined cross-polarization level of the circularly-polarized antenna probes of the first and second types. The determination may be performed by one or more processors.

By Friis transmission equation, the measured amplitudes obtained from steps 102A and 102B ($|S_{21,LL}|$ is the amplitude measured in step 102A and $|S_{21,LR}|$ is the measured in step 102B) can be expressed as:

$$|S_{21,LL}|^2 = (G_{CP,LHCP}G_{CP,LHCP} + G_{CP,RHCP}G_{CP,RHCP}) \cdot \left(\frac{\lambda}{4\pi d}\right)^2 \cdot G_{loss} \quad (1)$$

$$= (1+p^2) \cdot G_{CP,LHCP}^2 \cdot \left(\frac{\lambda}{4\pi d}\right)^2 \cdot G_{loss}$$

$$|S_{21,LR}|^2 = (G_{CP,LHCP}G_{CP,RHCP} + G_{CP,RHCP}G_{CP,LHCP}) \cdot \left(\frac{\lambda}{4\pi d}\right)^2 \cdot G_{loss} \quad (2)$$

$$= 2p \cdot G_{CP,LHCP}^2 \cdot \left(\frac{\lambda}{4\pi d}\right)^2 \cdot G_{loss}$$

where $G_{CP,LHCP}$ is the left-hand circularly-polarized gain of the left-hand circularly-polarized antenna probe or the right-hand circularly-polarized gain of the right-hand circularly-polarized antenna probe, $G_{CP,RHCP}$ is the right-hand circularly-polarized gain of the left-hand circularly-polarized antenna probe as well as the left-hand circularly-polarized gain of the right-hand circularly-polarized antenna probe, p is the cross-polarization level of the circularly-polarized antenna probes ($p=G_{CP,RHCP}/G_{CP,LHCP}$, p<1), $G_{loss}$ is the loss in the signal transmission path, is the wavelength relating to measuring frequency, and d is the distance between the phase centers of the pair of receiving and transmitting elements (antenna or probe). The signal loss in the transmission path can be caused by antenna feed, air absorption, measuring equipment, etc.

Thus, based on equations (1) and (2), the cross-polarization level of the circularly-polarized antenna probes can be calculated as:

$$p = \frac{|S_{21,LL}|^2}{|S_{21,LR}|^2} - \sqrt{\frac{|S_{21,LL}|^4}{|S_{21,LR}|^4} - 1} \quad (3)$$

where p is the cross-polarization level of the circularly-polarized antenna probe of the first and second types, $|S_{21,LL}|$ is the amplitude measured in step 102A, and $|S_{21,LR}|$ is the measured in step 102B.

By Friis transmission equation, the measured amplitudes obtained from steps 102A and 102B ($|S_{21,CS}|$ is the amplitude measured in step 102C, $|S_{21,LA}|$ is the amplitude measured in step 102D, and $|S_{21,RA}|$ is the amplitude measured in step 102E) can be expressed as:

$$|S_{21,CS}|^2 = \left(\frac{G_{CP,LHCP}G_{SGA,LP}}{2} + \frac{G_{CP,RHCP}G_{SGA,LP}}{2}\right) \cdot \left(\frac{\lambda}{4\pi d}\right)^2 \cdot G_{loss} \quad (4)$$

$$= \frac{G_{CP,LHCP}G_{SGA,LP}}{2}(1+p) \cdot \left(\frac{\lambda}{4\pi d}\right)^2 \cdot G_{loss}$$

$$|S_{21,LA}|^2 = (G_{CP,LHCP}G_{AUT,LHCP} + G_{CP,RHCP}G_{AUT,RHCP}) \cdot \left(\frac{\lambda}{4\pi d}\right)^2 \cdot G_{loss} \quad (5)$$

$$= G_{CP,LHCP} \cdot (G_{AUT,LHCP} + pG_{AUT,RHCP}) \cdot \left(\frac{\lambda}{4\pi d}\right)^2 \cdot G_{loss}$$

$$|S_{21,RA}|^2 = (G_{CP,RHCP}G_{AUT,LHCP} + G_{CP,LHCP}G_{AUT,RHCP}) \cdot \left(\frac{\lambda}{4\pi d}\right)^2 \cdot G_{loss} \quad (6)$$

$$= G_{CP,LHCP} \cdot (pG_{AUT,LHCP} + G_{AUT,RHCP}) \cdot \left(\frac{\lambda}{4\pi d}\right)^2 \cdot G_{loss}$$

where $G_{SGA,LP}$ is the linearly-polarized gain of the linearly-polarized standard-gain antenna, $G_{AUT,LHCP}$ is the left-hand circularly-polarized gain of the antenna under test and $G_{AUT,RHCP}$ is the right-hand circularly-polarized gain of the antenna under test.

By combining equations (4) and (5), it can be determined that:

$$G_{AUT,LHCP} + pG_{AUT,RHCP} = \frac{|S_{21,LA}|^2}{|S_{21,CS}|^2} \cdot \frac{G_{SGA,LP}}{2} \cdot (1+p) \quad (7)$$

By combining equations (4) and (6), it can be determined that:

$$pG_{AUT,LHCP} + G_{AUT,RHCP} = \frac{|S_{21,RA}|^2}{|S_{21,CS}|^2} \cdot \frac{G_{SGA,LP}}{2} \cdot (1+p) \quad (8)$$

By solving equations (7) and (8), the left-hand circularly-polarized and right-hand circularly-polarized gains of the antenna under test are:

$$G_{AUT,LHCP} = \frac{G_{SGA,LP}}{2(1-p)} \cdot \left(\frac{|S_{21,LA}|^2}{|S_{21,CS}|^2} - p\frac{|S_{21,RA}|^2}{|S_{21,CS}|^2}\right) \quad (9)$$

$$G_{AUT,RHCP} = \frac{G_{SGA,LP}}{2(1-p)} \cdot \left(\frac{|S_{21,RA}|^2}{|S_{21,CS}|^2} - p\frac{|S_{21,LA}|^2}{|S_{21,CS}|^2}\right) \quad (10)$$

where $G_{AUT,LHCP}$ is the left-hand circularly-polarized gain of the circularly-polarized antenna under test, $G_{AUT,RHCP}$ is the right-hand circularly-polarized gain of the circularly-polarized antenna under test, $G_{SGA,LP}$ is a linearly-polarized gain of the linearly-polarized standard-gain antenna, p is the cross-polarization level of the circularly-polarized antenna probes of the first and second types, $|S_{21,CS}|$ is the amplitude measured in step 102C, $|S_{21,LA}|$ is the amplitude measured in step 102D, and $|S_{21,RA}|$ is the amplitude measured in step 102E.

In method 100, the left-hand circularly-polarized antenna probe and the right-hand circularly-polarized antenna probe have the same construction, except for the difference in polarization, in which the left-hand circularly-polarized gain of the left-hand circularly-polarized antenna probe is substantially equal to right-hand circularly-polarized gain of the right-hand circularly-polarized antenna probe, and the right-hand circularly-polarized gain of the left-hand circularly-polarized antenna probe is substantially equal to left-hand circularly-polarized gain of the right-hand circularly-polarized antenna probe. The left-hand circularly-polarized antenna probe may be formed using, among other elements, a first linearly-polarized antenna and a first polarizer. The right-hand circularly-polarized antenna probe may be formed using, among other elements, a second linearly-polarized antenna and a second polarizer.

In method 100, the measurement device(s) used in steps 102A to 102E may include a spectrum analyzer and a signal generator. The signal generator is arranged to generate signals for transmission in the measuring step. The measurement device(s) may include the one or more processors for performing the determination step 104. Alternatively, the one or more processors for performing the determination step 104 are separate from the measurement device(s). Also, during measurements in steps 102A to 102E, the relative positions between the two devices (probe or antenna) are substantially the same. In this example, the phase center between the pair of receiving and transmitting devices (probe or antenna) is substantially constant (across steps 102A to 102E) and larger than the far-field range of each antenna or probe.

The method 100 may further include determining or mapping a radiation pattern of the circularly-polarized antenna under test by changing the relative position and/or angle between the pair of receiving and transmitting devices (probe or antenna) during the measuring steps 102D and 102E.

FIG. 2A shows an exemplary setup 202A for performing step 102A. In FIG. 2A, the setup 202A includes a first circularly-polarized antenna probe 204A and a second circularly-polarized antenna probe 206A connected to a measurement device 208A via respective antenna feed lines 210A. The antenna probes 204A, 206A are of the same polarization, i.e., both are left-hand circularly-polarized or right-hand circularly-polarized. The antenna probes 204A, 206A have a high gain in order to increase the signal-to-noise ratio in the transmission path. A distance between the antenna probes 204A, 206A is larger than the far-field range of each of the probes 204A, 206A. The measurement device 208A may include a vector network analyzer, or a signal generator and a spectrum analyzer, or any of their combination. A signal amplifier (not shown) could be used between the measurement device 208A and the antenna probe 204A, 206A to boost the signal amplitude. The phase centers of the two probes 204A, 206A are aligned.

FIG. 2B shows an exemplary setup 202B for performing step 102B. In FIG. 2B, the setup 202B is the same to that in FIG. 2A except that one of the circularly-polarized antenna probe is replaced by another circularly-polarized antenna probe with different polarization. In FIG. 2B, the setup 202B includes a first circularly-polarized antenna probe 204B and a second circularly-polarized antenna probe 206B connected to a measurement device 208B via respective antenna feed lines 210B. The antenna probes 204B, 206B are of different polarizations, one being left-hand circularly-polarized, the other being right-hand circularly-polarized. The distance between the phase centers of the two probes 204B, 206B remains substantially the same to that of FIG. 2A.

FIG. 2C shows an exemplary setup 202C for performing step 102C. In FIG. 2C, the setup 202C is the same to that in FIG. 2A except that one of the circularly-polarized antenna probe is replaced by a linearly-polarized standard-gain antenna. In FIG. 2C, the setup 202C includes a first circularly-polarized antenna probe 204C (left-hand circularly-polarized or right-hand circularly-polarized) and a linearly-polarized standard-gain antenna 212C connected to a measurement device 208C via respective antenna feed lines 210C. The distance between the phase centers of the probe 204C and the antenna 212C remains substantially the same to that of FIG. 2A.

FIG. 2D shows an exemplary setup 202D for performing step 102D. In FIG. 2D, the setup 202D is the same to that in FIG. 2A except that the circularly-polarized antenna probe is chosen to be a left-hand circularly-polarized (can alternatively be right-hand circularly-polarized) and the other circularly-polarized antenna probe is replaced with a circularly-polarized antenna under test. In FIG. 2D, the setup 202D includes the first circularly-polarized antenna probe 204D (left-hand circularly-polarized or right-hand circularly-polarized) and a circularly-polarized antenna under test T connected to a measurement device 208D via respective antenna feed lines 210D. The distance between the phase centers of the probe 208D and the antenna under test T remains substantially the same to that of FIG. 2A. The antenna under test T can be re-positioned by external positioner (not shown) for mapping and determining radiation pattern (e.g. using the measurement device 208D).

FIG. 2E shows an exemplary setup 202E for performing step 102E. In FIG. 2E, the setup 202E is the same to that in FIG. 2A except that the circularly-polarized antenna probe is chosen to be a right-hand circularly-polarized (can alternatively be left-hand circularly-polarized) and the other circularly-polarized antenna probe is replaced with a circularly-polarized antenna under test. In FIG. 2E, the setup 202E includes the second circularly-polarized antenna probe 204E (right-hand circularly-polarized or left-hand circularly-polarized) and the circularly-polarized antenna under test T connected to a measurement device 208E via respective antenna feed lines 210E. The distance between the phase centers of the probe 204E and the antenna under test T remains substantially the same to that of FIG. 2A. The antenna under test T can be re-positioned by external positioner (not shown) for mapping and determining radiation pattern (e.g. using the measurement device 208E).

In FIGS. 2A to 2E, during measurement, one of the devices (antenna or probe) is arranged to transmit signals to the other device for measurement, and the other one of the devices (antenna or probe) is arranged to receive signals transmitted from the other device. Preferably, the angle between the major axes of the elliptically-polarized wave radiated from one of the devices (antenna or probe) to the other device (antenna or probe) in the measurement steps is about 45 degrees.

Figure 3B:
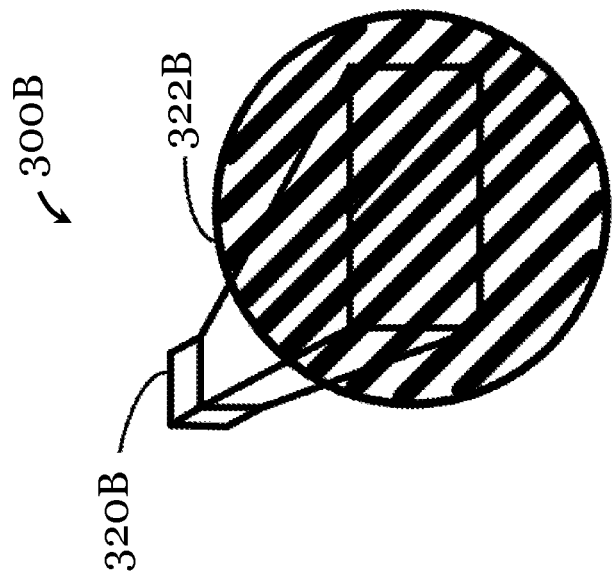
FIG. 3B is a schematic diagram showing a right-hand circularly-polarized antenna probe in one embodiment of the invention.
Figure 3A:
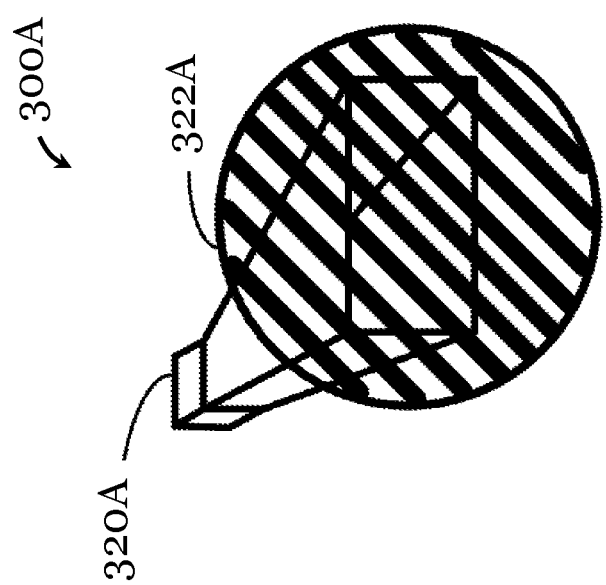
FIG. 3A is a schematic diagram showing a left-hand circularly-polarized antenna probe in one embodiment of the invention.

FIGS. 3A and 3B illustrate exemplary constructions of the left-hand and right-hand circularly-polarized antenna probes 300A, 300B. In FIG. 3A, the left-hand circularly-polarized antenna probe 300A includes a feed antenna 320A in the form of a rectangular horn antenna with a feeding waveguide that can be connected to a coaxial line using an adapter. The probe also include a polarizer 322A that includes a combination of periodic strips made by dielectric material, where the direction of the strips is placed about 45 degrees or about 135 degrees to the E-plane of the feed antenna. In FIG. 3B, the right-hand circularly-polarized antenna probe 300B is the same to the left-hand circularly-polarized antenna probe 300A shown in FIG. 3A (also has a feed antenna 320B and a polarized 322B), except that the polarizer 322B has 90 degrees angle difference to the polarizer 322A in the left-hand circularly-polarized antenna probe 300A.

Figure 3D:
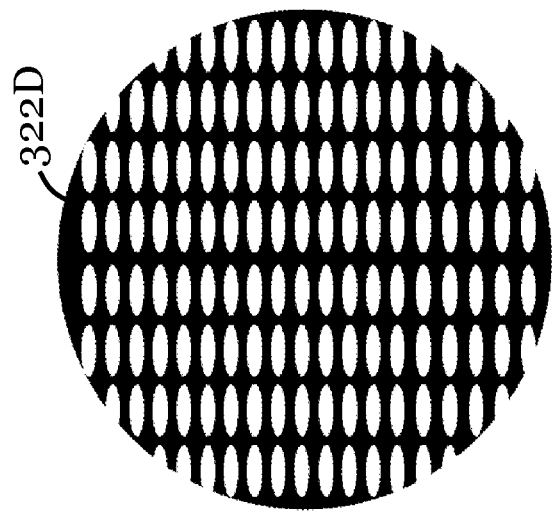
FIG. 3D is a schematic diagram showing a polarizer for a circularly-polarized antenna probe in one embodiment of the invention.
Figure 3C:
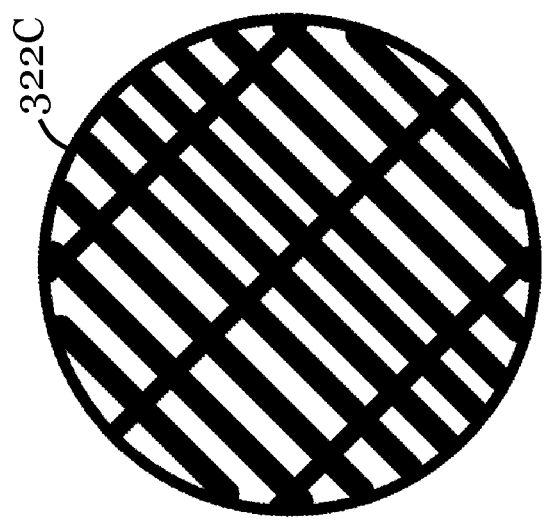
FIG. 3C is a schematic diagram showing a polarizer for a circularly-polarized antenna probe in one embodiment of the invention.

FIGS. 3C and 3D illustrate exemplary constructions of a polarizer 322C, 322D for a circularly-polarized antenna probe. In FIG. 3C, the polarizer 322C includes a combination of periodic strips made by dielectric material, where the direction of majority of the strips is placed about 45 degrees to the E-plane of the feed antenna (not shown, but similar to the one in FIG. 3A) and the direction of minority of the strips is placed about 135 degrees to the E-plane of the feed antenna (not shown, but similar to the one in FIG. 3A). This arrangement provides a generally left-hand circularly-polarized antenna probe. In FIG. 3D, the polarizer 322D includes a patch made by dielectric material, where the patch include multiple oval openings arranged in an array. This arrangement provides a circularly-polarized antenna probe, .e.g., a generally left-hand circularly-polarized antenna probe.

Figure 4:
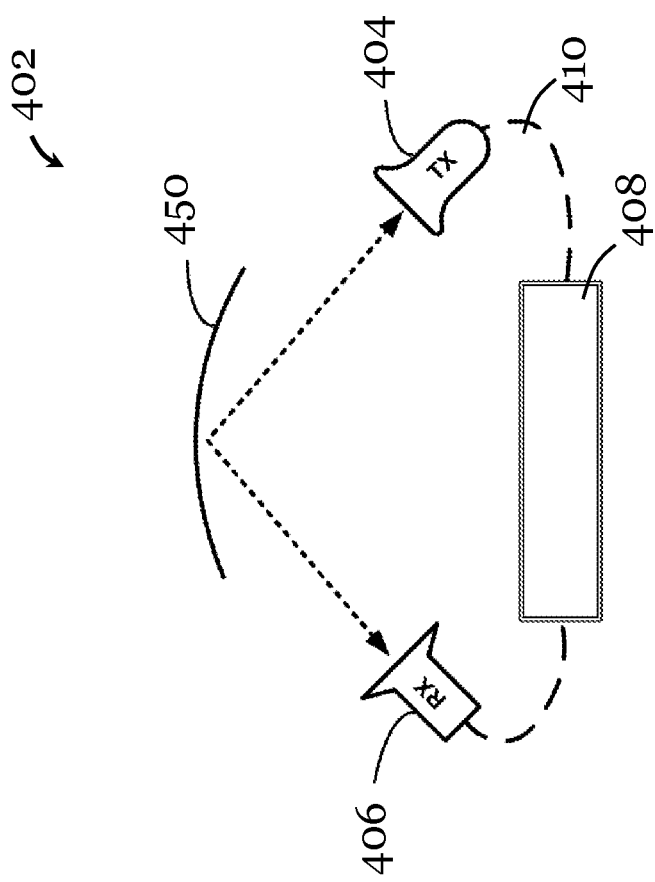
FIG. 4 is schematic diagram showing an alternative setup for measuring an amplitude of the forward gain between a transmitter and a receiver in one embodiment of the invention.

FIG. 4 illustrates an alternative setup 402 for FIGS. 2A to 2E. In applications where space is more confined, a reflector 450 (single-stage as shown) may be used for reflecting signals transmitted from one device to the other. The transmitting device 404 or the receiving device 406 could be one of the circularly-polarized antenna probes, the linearly-polarized standard-gain horn, or the antenna under test. The signal between the transmitting device 404 and the receiving device 406 is reflected by the reflector 450 to save space for measurement. In other examples the reflector could be more than one stage.

Figure 5:
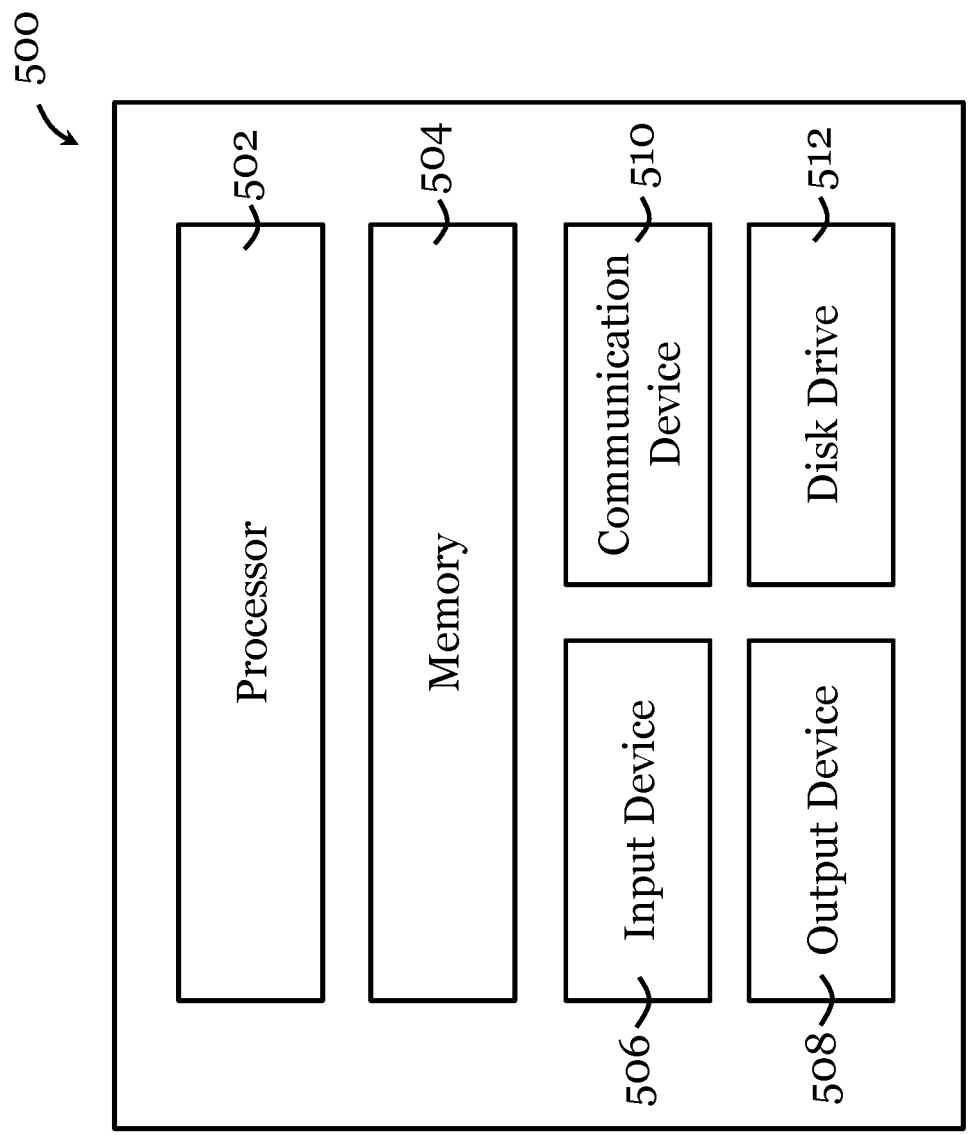
FIG. 5 is a block diagram of an information handling system that can be used to determine gain characteristics of a circularly-polarized antenna in one embodiment of the invention.

Referring to FIG. 5, there is shown a schematic diagram of an exemplary information handling system 500 that can be used as a server or other information processing systems in one embodiment of the invention. The information handling system 500 may be used to determine gain characteristics of a circularly-polarized antenna, for example, in step 104 of the method 100 of the above embodiments. The information handling system 500 may have different configurations, and it generally comprises suitable components necessary to receive, store, and execute appropriate computer instructions, commands, or codes. The main components of the information handling system 500 are a processor 502 and a memory unit 504. The processor 502 may be formed by one or more CPU, MCU, controllers, logic circuits, Raspberry Pi chip, etc. The memory unit 504 may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. Preferably, the information handling system 500 further includes one or more input devices 506 such as a keyboard, a mouse, a stylus, an image scanner, a microphone, a tactile input device (e.g., touch sensitive screen), and an image/video input device (e.g., camera). The information handling system 500 may further include one or more output devices 508 such as one or more displays (e.g., monitor), speakers, disk drives, headphones, earphones, printers, 3D printers, etc. The display may include a LCD display, a LED/OLED display, or any other suitable display that may or may not be touch sensitive. The information handling system 500 may further include one or more disk drives 512 which may encompass solid state drives, hard disk drives, optical drives, flash drives, and/or magnetic tape drives. A suitable operating system may be installed in the information handling system 500, e.g., on the disk drive 512 or in the memory unit 504. The memory unit 504 and the disk drive 512 may be operated by the processor 502. The information handling system 500 also preferably includes a communication device 510 for establishing one or more communication links (not shown) with one or more other computing devices such as servers, personal computers, terminals, tablets, phones, or other wireless or handheld computing devices. The communication device 510 may be a modem, a Network Interface Card (NIC), an integrated network interface, a radio frequency transceiver, an optical port, an infrared port, a USB connection, or other wired or wireless communication interfaces. The communication links may be wired or wireless for communicating commands, instructions, information and/or data. Preferably, the processor 502, the memory unit 504, and optionally the input devices 506, the output devices 508, the communication device 510 and the disk drives 512 are connected with each other through a bus, a Peripheral Component Interconnect (PCI) such as PCI Express, a Universal Serial Bus (USB), an optical bus, or other like bus structure. In one embodiment, some of these components may be connected through a network such as the Internet or a cloud computing network. A person skilled in the art would appreciate that the information handling system 500 shown in FIG. 5 is merely exemplary and different information handling systems 500 with different configurations may be applicable in the invention.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer or information processing hardware capable of implementing the function described.

Embodiments of the present invention have provided system and method for determining gain characteristics of a circularly-polarized antenna. The method utilizes amplitude information and a simple setup. Unnecessary rotation of components during measurements is reduced or eliminated. As a result, damage to fragile and expensive equipment can be reduced or avoided. The use of amplitude information provides more accurate results, especially at high frequencies, such as millimeter-wave and terahertz ranges, when compared with the use of phase information. As a side, expensive vector network analyzer can be replaced with the combination of the spectrum analyzer and the signal generator for measurement, which greatly reduces the cost of the antenna measurement system. One important aspect of the method is to decompose the gain characteristics of the circularly-polarized antenna probes into two orthogonal circularly-polarized components. The method in the above embodiments is useful for measuring gains of circularly-polarized antennas especially at millimeter-wave and terahertz range. The method greatly simplifies the measuring process and measurement system complexity. The method is also advantageous because circularly-polarized standard-gain antennas, especially those for the terahertz range, have very small bandwidth and requires assembling of a relatively large number of components for measuring.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

For example, the antenna under test need not be an antenna arranged for operation in millimeter-wave and terahertz ranges, but can be one that is arranged for operation in other wave or frequency ranges. The shape and form and size of the circularly-polarized antenna probe (left-hand or right-hand) can be different from illustrated.

The invention claimed is:

1. A method for determining gain characteristics of a circularly-polarized antenna, comprising:
receiving a measured first amplitude of a forward gain between a circularly-polarized antenna probe of a first type and a linearly-polarized standard-gain antenna, a measured second amplitude of a forward gain between a circularly-polarized antenna probe of a first type and a circularly-polarized antenna under test, and a measured third amplitude of a forward gain between a circularly-polarized antenna probe of a second type and the circularly-polarized antenna under test; and
determining a left-hand circularly-polarized gain and a right-hand circularly-polarized gain of the circularly-polarized antenna under test based on the measured first amplitude, the measured second amplitude, the measured third amplitude, and a cross-polarization level of the circularly-polarized antenna probes of the first and second types;
wherein the circularly-polarized antenna probe of the first type is one of a left-hand circularly-polarized antenna probe and a right-hand circularly-polarized antenna probe, and the circularly-polarized antenna probe of the second type is the other one of the left-hand circularly-polarized antenna probe and the right-hand circularly-polarized antenna probe.

2. The method of claim 1, further comprising
measuring a first amplitude of a forward gain between a circularly-polarized antenna probe of a first type and a linearly-polarized standard-gain antenna to obtain the measured first amplitude,
measuring a second amplitude of a forward gain between a circularly-polarized antenna probe of a first type and a circularly-polarized antenna under test to obtain the measured second amplitude, and
measuring a third amplitude of a forward gain between a circularly-polarized antenna probe of a second type and the circularly-polarized antenna under test to obtain the measured third amplitude.

3. The method of claim 2, wherein the circularly-polarized antenna probe of the first type used for measuring the first amplitude and the circularly-polarized antenna probe of the first type used for measuring the second amplitude is the same probe.

4. The method of claim 1, wherein the left-hand circularly-polarized gain of the left-hand circularly-polarized antenna probe is substantially equal to right-hand circularly-polarized gain of the right-hand circularly-polarized antenna probe, and the right-hand circularly-polarized gain of the left-hand circularly-polarized antenna probe is substantially equal to left-hand circularly-polarized gain of the right-hand circularly-polarized antenna probe.

5. The method of claim 4, wherein the left-hand circularly-polarized antenna probe and a right-hand circularly-polarized antenna probe have the same construction.

6. The method of claim 2, wherein the left-hand circularly-polarized antenna probe comprises a first linearly-polarized antenna and a first polarizer, and the right-hand circularly-polarized antenna probe comprises a second linearly-polarized antenna and a second polarizer.

7. The method of claim 6, wherein the first polarizer is arranged at a first angle with respect to a E-plane of the linearly-polarized antenna, and the second polarizer is arranged at a second angle, different from the first angle, with respect to a E-plane of the linearly-polarized antenna.

8. The method of claim 7, wherein a difference between the first angle and the second angle is about 90 degrees.

9. The method of claim 1, wherein the left-hand circularly-polarized gain and the right-hand circularly-polarized gain of the circularly-polarized antenna under test are determined based on:

$$G_{AUT,LHCP} = \frac{G_{SGA,LP}}{2(1-p)} \cdot \left( \frac{|S_{21,LA}|^2}{|S_{21,CS}|^2} - p\frac{|S_{21,RA}|^2}{|S_{21,CS}|^2} \right)$$

$$G_{AUT,RHCP} = \frac{G_{SGA,LP}}{2(1-p)} \cdot \left( \frac{|S_{21,RA}|^2}{|S_{21,CS}|^2} - p\frac{|S_{21,LA}|^2}{|S_{21,CS}|^2} \right)$$

where
$G_{AUT,LHCP}$ is the left-hand circularly-polarized gain of the circularly-polarized antenna under test,
$G_{AUT,RHCP}$ is the right-hand circularly-polarized gain of the circularly-polarized antenna under test,
$G_{SGA,LP}$ is a linearly-polarized gain of the linearly-polarized standard-gain antenna, p is the cross-polarization level of the circularly-polarized antenna probes of the first and second types,
$|S_{21,CS}|$ is the measured first amplitude,
$|S_{21,LA}|$ is the measured second amplitude, and
$|S_{21,RA}|$ is the measured third amplitude.

10. The method of claim 2, wherein measuring the first amplitude of a forward gain between the circularly-polarized antenna probe of the first type and the linearly-polarized standard-gain antenna comprises:
positioning, relatively, the circularly-polarized antenna probe of the first type and the linearly-polarized standard-gain antenna, and
transmitting signals from one of the circularly-polarized antenna probe of the first type and the linearly-polarized standard-gain antenna to the other one of the circularly-polarized antenna probe of the first type and the linearly-polarized standard-gain antenna for measurement.

11. The method of claim 2, wherein measuring the second amplitude of a forward gain between the circularly-polarized antenna probe of the first type and the circularly-polarized antenna under test comprises:
positioning, relatively, the circularly-polarized antenna probe of the first type and the circularly-polarized antenna under test, and transmitting signals from one of the circularly-polarized antenna probe and the linearly-polarized standard-gain antenna to the other one of the circularly-polarized antenna probe and the linearly-polarized standard-gain antenna for measurement.

12. The method of claim 2, wherein measuring the third amplitude of a forward gain between the circularly-polarized antenna probe of the second type and the circularly-polarized antenna under test comprises:
positioning, relatively, the circularly-polarized antenna probe of the second type and the circularly-polarized antenna under test, and
transmitting signals from one of the circularly-polarized antenna probe of the second type and the linearly-polarized standard-gain antenna to the other one of the circularly-polarized antenna probe of the second type and the linearly-polarized standard-gain antenna for measurement.

13. The method of claim 2, wherein a relative position between the circularly-polarized antenna probe of the first type and the linearly-polarized standard-gain antenna during the measurement, a relative position between the circularly-polarized antenna probe of the first type and the circularly-polarized antenna under test during the measurement, and a relative position between the circularly-polarized antenna probe of the second type and the circularly-polarized antenna under test during the measurement are substantially the same.

14. The method of claim 2, wherein the measurements of the first amplitude, the second amplitude, and the third amplitude are measured using the same measurement device.

15. The method of claim 1, wherein the left-hand circularly-polarized gain and the right-hand circularly-polarized gain of the circularly-polarized antenna under test are determined using one or more processors.

16. The method of claim 1, further comprising determining the cross-polarization level of the circularly-polarized antenna probes of the first and second types.

17. The method of claim 16, wherein determining the cross-polarization level of the circularly-polarized antenna probes of the first and second types comprises:

measuring a fourth amplitude of a forward gain between two substantially identical circularly-polarized antenna probes of the first type or between two substantially identical circularly-polarized antenna probes of the second type; and measuring a fifth amplitude of a forward gain between a circularly-polarized antenna probe of the first type and a circularly-polarized antenna probe of the second type.

18. The method of claim 17, wherein the fourth amplitude and the fifth amplitude are measured using the same measurement device.

19. The method of claim 18, wherein the cross-polarization level of the circularly-polarized antenna probes of the first and second types is determined based on:

$$p = \frac{|S_{21,LL}|^2}{|S_{21,LR}|^2} - \sqrt{\frac{|S_{21,LL}|^4}{|S_{21,LR}|^4} - 1}$$

where
- p is the cross-polarization level of the circularly-polarized antenna probe of the first and second types,
- $|S_{21,LL}|$ is the measured fourth amplitude, and
- $|S_{21,LR}|$ is the measured fifth amplitude.

20. The method of claim 1, wherein the circularly-polarized antenna under test is arranged for operation in millimeter-wave and terahertz ranges.

21. A system for determining gain characteristics of a circularly-polarized antenna, comprising:

one or more processors arranged to receive a measured first amplitude of a forward gain between a circularly-polarized antenna probe of a first type and a linearly-polarized standard-gain antenna, a measured second amplitude of a forward gain between a circularly-polarized antenna probe of a first type and a circularly-polarized antenna under test, and a measured third amplitude of a forward gain between a circularly-polarized antenna probe of a second type and the circularly-polarized antenna under test; and determine a left-hand circularly-polarized gain and a right-hand circularly-polarized gain of the circularly-polarized antenna under test based on the measured first amplitude, the measured second amplitude, the measured third amplitude, and a cross-polarization level of the circularly-polarized antenna probes of the first and second types;

wherein the circularly-polarized antenna probe of the first type is one of a left-hand circularly-polarized antenna probe and a right-hand circularly-polarized antenna probe, and the circularly-polarized antenna probe of the second type is the other one of the left-hand circularly-polarized antenna probe and the right-hand circularly-polarized antenna probe.

* * * * *